United States Patent
Tsai et al.

(10) Patent No.: US 11,184,014 B2
(45) Date of Patent: *Nov. 23, 2021

(54) VOLTAGE-CONTROLLED OSCILLATOR AND PHASE-LOCKED LOOP

(71) Applicant: REALTEK SEMICONDUCTOR CORPORATION, Hsinchu (TW)

(72) Inventors: Sung-Lin Tsai, Yunlin County (TW); Kuo-Wei Wu, Taoyuan (TW); Jian-Ru Lin, Nantou County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/916,257

(22) Filed: Jun. 30, 2020

(65) Prior Publication Data

US 2020/0336150 A1 Oct. 22, 2020

Related U.S. Application Data

(62) Division of application No. 16/168,113, filed on Oct. 23, 2018, now Pat. No. 10,756,740.

(30) Foreign Application Priority Data

Nov. 8, 2017 (TW) .................................. 106138547

(51) Int. Cl.
*H03L 7/099* (2006.01)
*H03L 7/093* (2006.01)
*H03K 3/03* (2006.01)

(52) U.S. Cl.
CPC ......... *H03L 7/0995* (2013.01); *H03K 3/0315* (2013.01); *H03L 7/093* (2013.01)

(58) Field of Classification Search
CPC ....... H03L 7/0995; H03L 7/093; H03L 7/099; H03K 3/0315
See application file for complete search history.

(56) References Cited

U.S. PATENT DOCUMENTS 7,042,302 B2 4/2006 Chien
7,564,320 B2 7/2009 Chiu et al.
(Continued)

FOREIGN PATENT DOCUMENTS

TW 200803175 1/2008

OTHER PUBLICATIONS

Taiwan Intellectual Property Office, Office Action in counterpart TW application (appl. no. 106138547) dated Jun. 28, 2018. Summary in English on p. 1.

*Primary Examiner* — Ryan Johnson
(74) *Attorney, Agent, or Firm* — WPAT, PC

(57) ABSTRACT

Disclosed is a voltage-controlled oscillator (VCO) capable of providing an effective high VCO gain against slow change of an input voltage caused by the variation of manufacturing processes, temperature, voltage, etc. and providing an effective low VCO gain against rapid change of the input voltage for reducing jitter. The VCO includes: an input circuit generating an input current according to an input voltage; a first current supply circuit generating a first output current according to the input current; a second current supply circuit generating a second output current according to the input current; a filter coupled to the input circuit and the second current supply circuit and configured to slow down the influence caused by the variation of the input current on the second current supply circuit; and an oscillating circuit generating an output clock according to the first output current and the second output current.

11 Claims, 6 Drawing Sheets

(56) References Cited

U.S. PATENT DOCUMENTS

| | | |
|---|---|---|
| 8,143,957 B2 | 3/2012 | Quan et al. |
| 8,253,498 B2 | 8/2012 | Yagishita et al. |
| 8,536,912 B2 | 9/2013 | Cherkassky |
| 8,604,884 B2 | 12/2013 | Coban et al. |
| 10,756,740 B2 * | 8/2020 | Tsai ..................... H03K 3/0315 |

* cited by examiner

VOLTAGE-CONTROLLED OSCILLATOR AND PHASE-LOCKED LOOP

BACKGROUND OF THE INVENTION

1. Field of the Invention

The present invention relates to an oscillator and a phase-locked loop, especially to a voltage-controlled oscillator and a phase-locked loop including the voltage-controlled oscillator.

2. Description of Related Art

The jitter (i.e., phase noise) of an input signal of a phase-locked loop (PLL) is relevant to the output performance of the PLL. Provided input noise remains the same, the lower the gain of a voltage-controlled oscillator (VCO) of a PLL, the smaller the output jitter of the PLL. Therefore, in order to realize a low-jitter PLL, a low-gain VCO is required.

However, the oscillation frequency of a VCO is affected by manufacturing processes, temperature, voltage, etc., and a low-gain VCO is vulnerable to the influence of the above-mentioned variables. In order to prevent the output frequency of a VCO from being seriously affected, a conventional low-gain VCO usually cooperates with an additional frequency-calibration circuit to mitigate the variation of manufacturing processes; unfortunately, the frequency deviation caused by the variation of temperature and voltage is still likely to lead the output frequency of the conventional low-gain VCO to exceed an expected range while a circuit system using a PLL including the conventional low-gain VCO usually forbids the PLL to carry out frequency calibration during a regular operation; therefore though the jitter should be reduced by a low VCO gain, the gain of the conventional low-gain VCO cannot be overly decreased and should be greater enough to tolerate the variation of temperature and voltage.

In light of the above, although a high-gain VCO is relatively resistant to the variation of manufacturing processes, temperature, voltage, etc., as the specification of a circuit product requires stricter jitter requirements, the high-gain VCO has to use a large-size loop filter to fill the stricter jitter requirements. Sometimes the said loop filter should be realized by an external capacitor outside the chip including the VCO, and the external capacitor or the equivalent thereof leads to the increase of circuit area and cost.

SUMMARY OF THE INVENTION

An object of the present invention is to provide a voltage-controlled oscillator (VCO) and a phase-locked loop (PLL) including the VCO capable of preventing the problems of the prior art.

Another object of the present invention is to achieve the advantages of a high VCO gain and a low VCO gain concurrently. In the present invention, the slow change of an input voltage caused by the variation of manufacturing processes, temperature, voltage, etc. is offset by a high VCO gain and the jitter caused by the noise within a designed bandwidth is offset by a low VCO gain. Accordingly, the present invention achieves low output jitter, reduces the size of a loop filter and the related cost and has no need to use an additional frequency-calibration circuit.

The present invention discloses a VCO. An embodiment of the VCO includes: an input circuit configured to generate an input current according to an input voltage; a first current supply circuit configured to generate a first output current according to the input current; a second current supply circuit configured to generate a second output current according to the input current; a VCO filter coupled to the input circuit and the second current supply circuit, and the VCO filter configured to slow down an influence caused by a variation of the input current on the second current supply circuit; and an oscillating circuit configured to generate an output clock according to the first output current and the second output current.

The present invention also discloses a PLL. An embodiment of the PLL includes a phase-frequency detector, a charge pump, a filter, a VCO and a loop divider. The phase-frequency detector is configured to detect a difference between a reference clock and a feedback clock and thereby output a detection signal. The charge pump is configured to generate a charging/discharging signal according to the detection signal. The filter is configured to determine an input voltage according to the charging/discharging signal. The VCO includes: an input circuit configured to generate an input current according to an input voltage; a first current supply circuit configured to generate a first output current according to the input current; a second current supply circuit configured to generate a second output current according to the input current; a VCO filter coupled to the input circuit and the second current supply circuit, and the VCO filter configured to slow down an influence caused by a variation of the input current on the second current supply circuit; and an oscillating circuit configured to generate an output clock according to the first output current and the second output current. The loop divider is configured to generate the feedback clock according to the output clock. In this embodiment, a ratio of a filter bandwidth of the VCO filter to a loop bandwidth of the phase-locked loop is not greater than one percent.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The following description is written by referring to terms of this industrial field. If any term is defined in the following description, such term should be explained accordingly.

The present disclosure includes a voltage-controlled oscillator (VCO) and a phase-locked loop (PLL) including the VCO. The VCO and the PLL are capable of providing an effective high VCO gain against slow change of an input voltage for resisting the variation of manufacturing processes, temperature, voltage, etc. and providing an effective low VCO gain against rapid change of the input voltage for reducing jitter.

Figure 1:
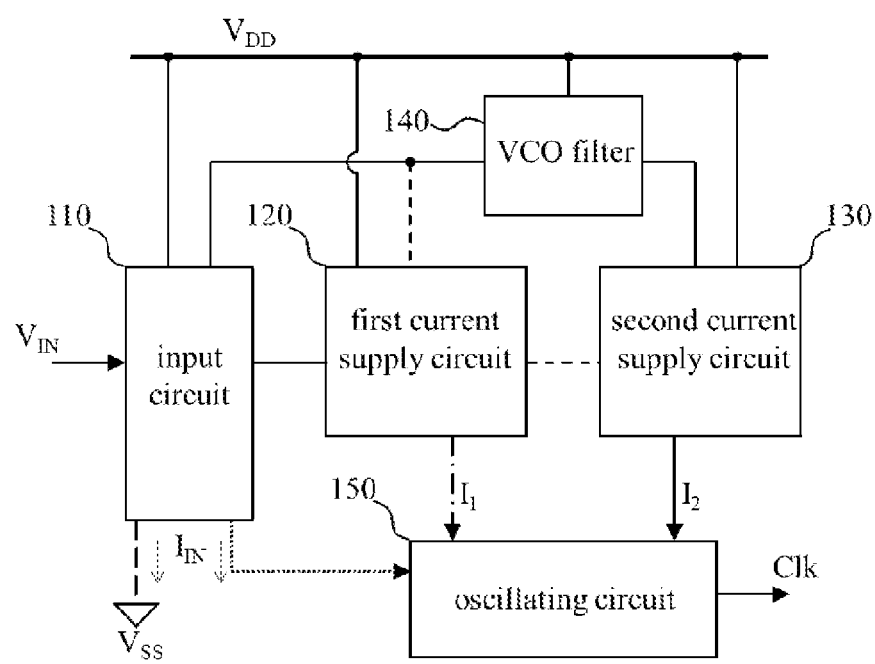
FIG. 1 shows an embodiment of the voltage-controlled oscillator of the present invention.

FIG. 1 shows an embodiment of the VCO of the present invention. The VCO 100 of FIG. 1 includes an input circuit 110, a first current supply circuit 120, a second current supply circuit 130, a VCO filter 140 and an oscillating circuit 150. The input circuit 110 is coupled to a low voltage terminal Vss such as a ground terminal (as indicated by the long-dashed line in FIG. 1) or coupled to the oscillating circuit 150 (as indicated by the dotted line of FIG. 1), and the input circuit 110 is configured to generate an input current $I_{IN}$ according to an input voltage $V_{IN}$. The first current supply circuit 120 is coupled to the input circuit 110 and a high voltage terminal $V_{DD}$ such as a power supply terminal, and the first current supply circuit 120 is configured to generate a first output current $I_1$ according to the input current $I_{IN}$. The first current supply circuit 120 is directly or indirectly coupled to the second current supply circuit 130 (as indicated by the short-dashed line of FIG. 1); additionally, in some embodiments of the present invention (e.g., the embodiments of FIGS. 2, 4 and 5) the first current supply circuit 120 directly outputs the first output current $I_1$ to the oscillating circuit 150 so that the first output current $I_1$ does not pass though the input circuit 110, and in some embodiments of the present invention (e.g., the embodiment of FIG. 3) the first current supply circuit 120 treats the input circuit 110 as a part of the first current supply circuit 120 so as to output the input current IN (acting as the first output current $I_1$) to the oscillating circuit 150 (as indicated by the dotted line of FIG. 1). The second current supply circuit 130 is coupled to the high voltage terminal $V_{DD}$ and configured to generate a second output current $I_2$ according to the input current $I_{IN}$, in which the current driving capability of the second current supply circuit 130 is stronger than the current driving capability of the first current supply circuit 120; in other words, the second output current $I_2$ is greater than the first output current $I_1$. For instance, a ratio of the second output current $I_2$ to the first output current $I_1$ is between 4 and 25 (i.e., $4 \leq (I_2/I_1) \leq 25$). The VCO filter 140 is coupled to the input circuit 110, the second current supply circuit 130 and the high voltage terminal $V_{DD}$, and the VCO filter 140 is configured to slow down the speed of the influence caused by the variation of the input current $I_{IN}$ on the second current supply circuit 130 having the stronger current driving capability and thereby reduce the influence of the slow change of the input voltage $V_{IN}$ (caused by the variation of manufacturing processes, temperature, voltage, etc.) on the oscillating circuit 150; in this circumstance, the VCO 100 functions as a high-gain VCO. In the meantime, the VCO filter 140 has no substantial effect on the first current supply circuit 120 having the weaker current driving capability so that the output of the oscillating circuit 150 can immediately change in response to the rapid change of the first output current $I_1$ caused by the rapid change of the input voltage $V_{IN}$, in which the output variation in response to the rapid change of the first output current $I_1$ won't cause too much influence because the first output current $I_1$ in comparison with the second output current $I_2$ is smaller; in this circumstance, the VCO 100 functions as a low-gain VCO. The oscillating circuit 150 is configured to generate an output clock Clk according to the first output current $I_1$ and the second output current $I_2$. It should be noted that in FIG. 1 a dashed/dotted line stands for an optional connection which is required or omitted in accordance with the demand of implementation.

Figure 2:
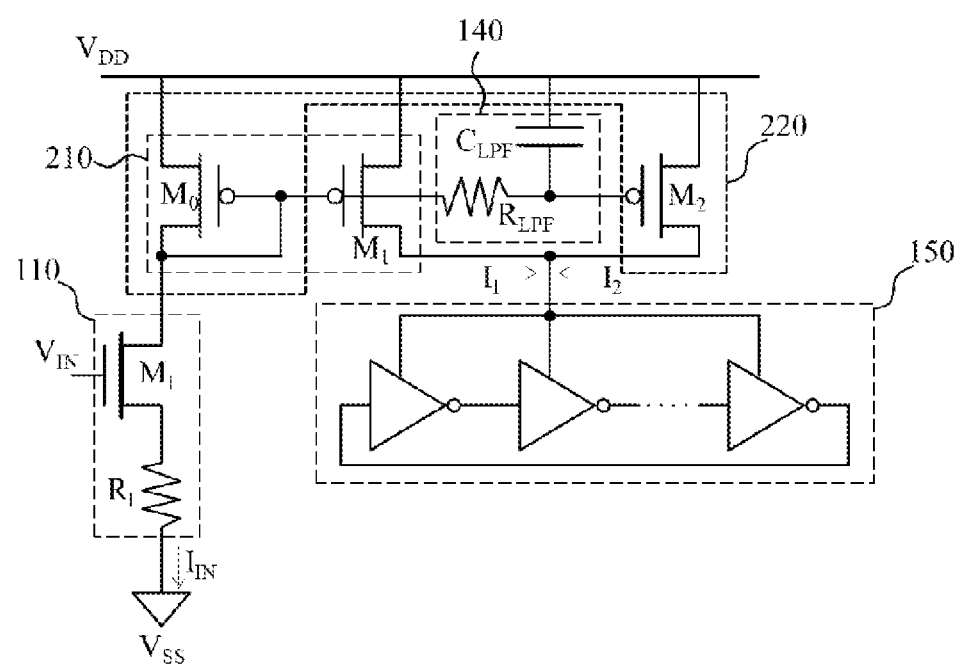
FIG. 2 shows an exemplary implementation of the voltage-controlled oscillator of FIG. 1.

FIG. 2 shows an exemplary implementation of the VCO 100 of FIG. 1. As shown in FIG. 2, the input circuit 110 includes an input transistor $M_I$ and an input resistor $R_I$. The input transistor $M_I$ includes a gate, a high voltage terminal (e.g., a drain of the input transistor $M_I$) coupled to the first current supply circuit 120, and a low voltage terminal (e.g., a source the input transistor $M_I$) coupled to the input resistor $R_I$. The gate receives the input voltage $V_{IN}$ and thereby the input circuit 110 generates the input current $I_{IN}$ according to the input voltage $V_{IN}$ and the input resistor $R_I$. The first current supply circuit 120 here is a first current mirror 210 including a transistor $M_0$ and a transistor $M_1$. Based on the principle of current mirror, a ratio of the first output current $I_1$ passing through the transistor $M_1$ to the input current $I_{IN}$ passing through the transistor $M_0$ is a designated ratio (e.g., a fixed ratio or one of predetermined ratios of the current mirror 210 being an adjustable current mirror), and the current ratio $I_1/I_{IN}$ can be determined by controlling a ratio of the size of the transistor $M_1$ to the size of the transistor $M_0$ or the like (e.g., a ratio of the number of transistor unit(s) of the transistor $M_1$ to the number of the transistor unit(s) of the transistor $M_0$). The second current supply circuit 130 here is a second current mirror 220 including the transistor $M_0$ and a transistor $M_2$, which implies that the second current supply circuit 130 and the first current supply circuit 120 share the same transistor $M_0$. Based on the principle of current mirror, a ratio of the second output current $I_2$ passing through the transistor $M_2$ to the input current $I_{IN}$ passing through the transistor $M_0$ is a designated ratio (e.g., a fixed ratio or one of predetermined ratios of the second current mirror 220 being an adjustable current mirror), and the current ratio $I_2/I_{IN}$ can be determined by controlling a ratio of the size of the transistor $M_2$ to the size of the transistor $M_0$ or the like (e.g., a ratio of the number of transistor unit(s) of the transistor $M_2$ to the number of the transistor unit(s) of the transistor $M_0$). The VCO filter 140 includes a passive low pass filter including a capacitor $C_{LPF}$ and a resistor $R_{LPF}$; as the capacitor $C_{LPF}$ is charged/discharged, the voltage difference between the two ends of the resistor $R_{LPF}$ is gradually reduced or becomes substantially negligible so as to reflect the variation of the input voltage $V_N$ in a manner of low speed. The oscillating circuit 150 includes a ring oscillator including a plurality of oscillating units, each of which (e.g., an inverter or the equivalent thereof such as a current mode logic circuit) is driven by the sum of the first output current $I_1$ and the second output current $I_2$ and generates a clock according to the output of a preceding oscillating unit. It should be noted that in FIGS. 2-5, different dotted/dashed line blocks stand for different circuits; although some dotted/dashed line blocks overlap, each dotted/dashed line block is clearly defined in the specification and thus the overlap won't hinder people of ordinary skill in the art from understanding the present invention by referring to the specification and the drawings.

Figure 3:
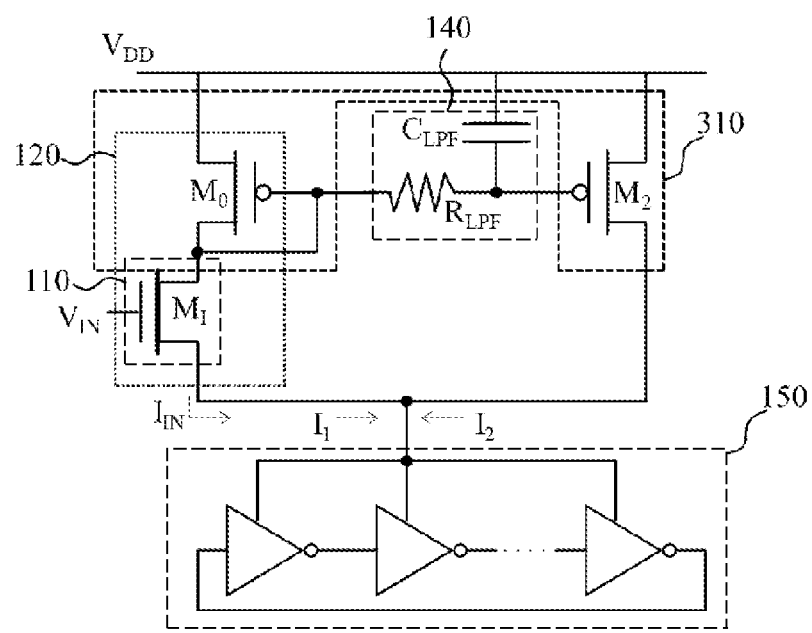
FIG. 3 shows an exemplary implementation of the voltage-controlled oscillator of FIG. 1.

In order to increase the flexibility of implementation, at least one of the first current supply circuit 120 and the second current supply circuit 130 is a circuit other than a current mirror. FIG. 3 shows an exemplary implementation of the VCO 100 of FIG. 1. In comparison with FIG. 2, the first current supply circuit 120 of FIG. 3 includes no current mirror. In detail, the gate of the input transistor $M_I$ of the input circuit 110 in FIG. 3 receives the input voltage $V_{IN}$, the high voltage terminal of the input transistor $M_I$ is coupled to the transistor $M_2$ of the second current supply circuit 130 via the VCO filter 140, and the low voltage terminal of the input transistor $M_I$ is coupled to the oscillating circuit 150; the first current supply circuit 120 includes the transistor $M_0$ and the input transistor $M_I$, which implies that the first current supply circuit 120 and the input circuit 110 share the input transistor $M_I$ so that the input current $I_N$ of the input transistor $M_I$ is treated as the first output current $I_1$; the second current supply circuit 130 includes the transistor $M_2$ and the transistor $M_0$ composing a current mirror 310, which implies that the second current supply circuit 130 and the first current supply circuit 120 share the same transistor $M_0$; based on the principle of current mirror, a ratio of the second output current $I_2$ passing the transistor $M_2$ to the input current $I_N$ passing the transistor $M_0$ is a predetermined ratio (e.g., a fixed ratio or one of predetermined ratios of the current mirror 310 being an adjustable current mirror), and the current ratio $I_2/I_{IN}$ can be determined by controlling a ratio of the size of the transistor $M_2$ to the size of the transistor $M_0$ or a the like (e.g., a ratio of the number of the transistor unit(s) of the transistor $M_2$ to the number of the transistor unit(s) of the transistor $M_0$).

Figure 4:
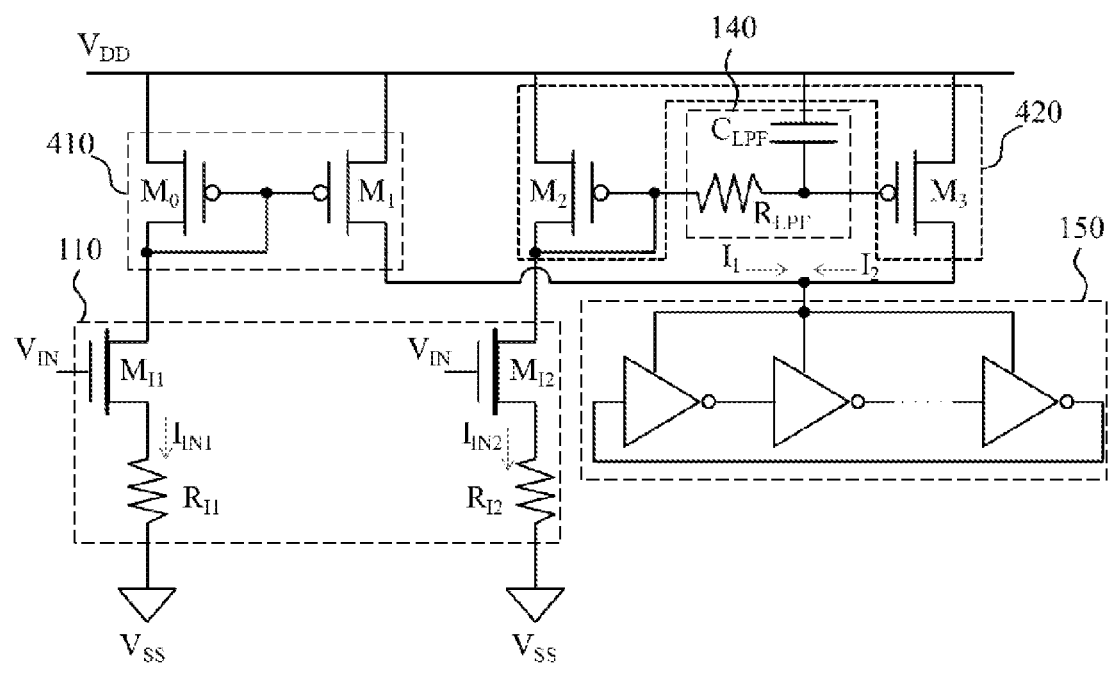
FIG. 4 shows an exemplary implementation of the voltage-controlled oscillator of FIG. 1.

In order to increase the flexibility of implementation, the first current supply circuit 120 and the second current supply circuit 130 can operate according to different input currents respectively. FIG. 4 shows an exemplary implementation of the VCO 100 of FIG. 1. In comparison with FIG. 2, in FIG. 4 the first current supply circuit 120 and the second current supply circuit 130 operate according to a first part $I_{IN1}$ of the input current $I_N$ and a second part $I_{IN2}$ of the input current $I_N$ respectively, in which the input current $I_N$ could be viewed as the combination of the first part $I_{IN1}$ and the second part $I_{IN2}$. In detail, the input circuit 110 includes a first input transistor $M_{I1}$, a first input resistor $R_{I1}$, a second input transistor $M_{I2}$, and a second input resistor $R_{I2}$. The gates of the transistor $M_{I1}$ and the transistor $M_{I2}$ receives the input voltage $V_{IN}$ respectively so that the transistor $M_{I1}$ generates the first part $I_{IN1}$ of the input current $I_N$ according to the input voltage $V_{IN}$ and the first input resistor $R_{I1}$ and the transistor $M_{I2}$ generates the second part $I_{IN2}$ of the input current $I_{IN1}$ according to the input voltage $V_{IN}$ and the second input resistor $R_{I2}$. In this exemplary implementation, by selecting proper transistors and resistors, the current $I_{IN1}$ can be equal to or different from the current $I_{IN2}$. The first current supply circuit 120 includes a first current mirror 410 including the transistor $M_0$ and the transistor $M_1$; based on the principle of current mirror, a ratio of the first output current $I_1$ passing the transistor $M_1$ to the first part $I_{IN1}$ of the input current $I_N$ passing through the transistor $M_0$ is a predetermined ratio (e.g., a fixed ratio or one of predetermined ratios of the first current mirror 410 being an adjustable current mirror), and the current ratio Lam can be set by controlling a ratio of the size of the transistor $M_1$ to the size of the transistor $M_0$ or the like (e.g., a ratio of the number of the transistor unit(s) of the transistor $M_1$ to the number of the transistor unit(s) of the transistor $M_0$). The second current supply circuit 130 includes a second current mirror 420 including the transistor $M_2$ and a transistor $M_3$; based on the principle of current mirror, a ratio of the second output current $I_2$ passing through the transistor $M_3$ and the second part $I_{IN2}$ of the input current $I_{IN}$ passing through the transistor $M_2$ is a predetermined ratio (e.g., a fixed ratio or one of predetermined ratios of the second current mirror 420 being an adjustable current mirror), and the current ratio $I_2/I_{IN2}$ can be set by controlling a ratio of the size of the transistor $M_3$ to the size of the transistor $M_2$ or the like (e.g., a ratio of the number of the transistor unit(s) of the transistor $M_3$ to the number of the transistor unit(s) of the transistor $M_2$).

Figure 5:
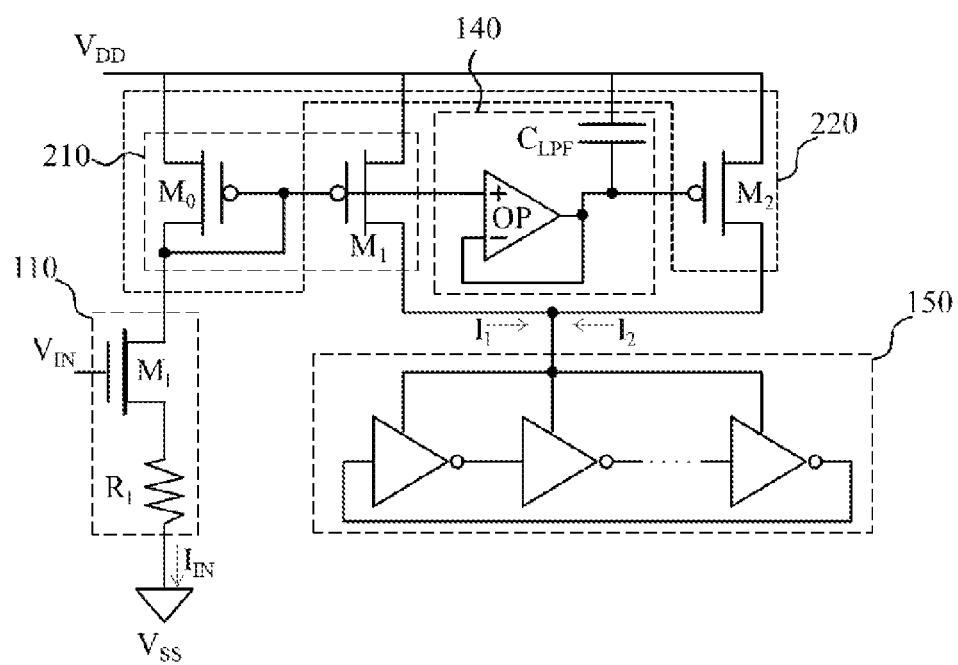
FIG. 5 shows an exemplary implementation of the voltage-controlled oscillator of FIG. 1.

In order to increase the flexibility of implementation, the VCO filter 140 can include a filter other than a passive low pass filter. FIG. 5 shows an exemplary implementation of the VCO 100 of FIG. 1. In comparison with FIG. 2, the VCO filter 140 of FIG. 5 is an active low pass filter including a capacitor $C_{LPF}$ and an operational amplifier OP. As the capacitor $C_{LPF}$ is charged/discharged, the voltage at the output terminal (which is coupled to the gate of the transistor $M_2$) of the operational amplifier OP is close to or equal to the voltage (i.e., the gate voltages of the transistors $M_0$, $M_1$) at the positive input terminal of the operational amplifier OP.

Figure 6:
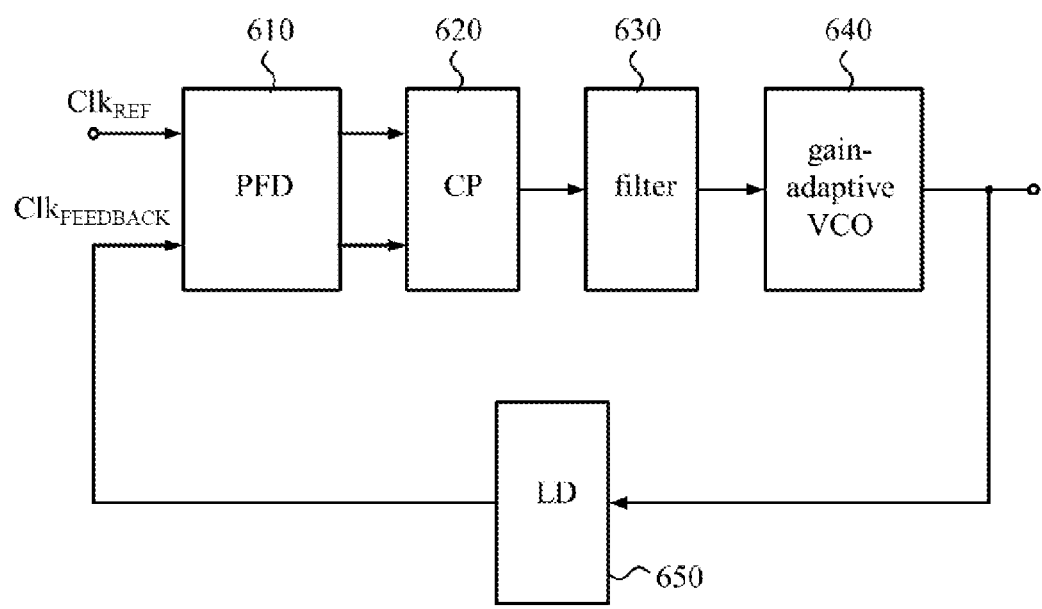
FIG. 6 shows an embodiment of the phase-locked loop of the present invention.

In addition to the VCO of FIG. 1, the present disclosure includes a PLL. FIG. 6 shows an embodiment of the PLL. The PLL 600 of FIG. 6 includes a phase frequency detector (PFD) 610, a charge pump (CP) 620, a filter 630, a gain-adaptive VCO 640 and a loop divider (LD) 650. The PFD 610 is configured to detect a difference between a reference clock $Clk_{REF}$ and a feedback clock $Clk_{FEEDBACK}$ and thereby output a detection signal. The CP 620 is configured to generate a charging/discharging signal according to the detection signal. The filter 630 (e.g., a low pass filter acting as a loop filter) is configured to determine an input voltage according to the charging/discharging signal. The gain-adaptive VCO 640 is configured to generate an output clock according to the input voltage. The LD 650 is configured to generate the feedback clock $Clk_{FEEDBACK}$ according to the output clock. Each of the PFD 610, the CP 620, the filter 630 and the LD 650 is a known circuit or a self-developed circuit, and thus the detail of these circuits is omitted. The gain-adaptive VCO 640 is the VCO 100 of FIG. 1 or the equivalent thereof. It should be noted that in the embodiment of FIG. 6 a ratio of a filter bandwidth of the VCO filter of the gain-adaptive VCO 640 to a loop bandwidth of the phase-locked loop can be optionally set to be not greater than one percent so as to achieve better performance.

Since people of ordinary skill in the art can appreciate the detail and the modification of the embodiment of FIG. 6 by referring to the disclosure of the embodiments of FIGS. 1~5, which means that each feature of the embodiments of FIGS. 1~5 can be applied to the embodiment of FIG. 6 in a reasonable way, repeated and redundant description having little to do with the requirements of written description and enablement is omitted here.

It should be noted that the way to carry out the present invention can be flexible. More specifically, if an implementation derived from the present invention is practicable, people of ordinary skill in the art can selectively make use of some or all of the features of any of the aforementioned embodiments or make use of some or all of the features of several of the embodiments to have the implementation come true.

To sum up, the VCO and the PLL of the present invention are capable of providing an effective high VCO gain against slow change of an input voltage (caused by the variation of manufacturing processes, temperature, voltage, etc.) and providing an effective low VCO gain against rapid change of the input voltage (caused by noise or other variables changing fast). As a result, the present invention can achieve low output jitter, reduce the area and the cost of a loop filter and have no need to use an additional frequency-calibration circuit.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A voltage-controlled oscillator (VCO), comprising:
an input circuit configured to generate an input current according to an input voltage, wherein the input circuit includes an input transistor and an input resistor that are coupled in series;
a first current supply circuit configured to generate a first output current according to the input current;
a second current supply circuit configured to generate a second output current according to the input current;
a VCO filter coupled to the input circuit and the second current supply circuit, and the VCO filter configured to slow down an influence caused by a variation of the input current on the second current supply circuit, wherein the VCO includes a capacitor that is coupled to the input transistor of the input circuit via a passive component or an active component; and
an oscillating circuit configured to generate an output clock according to the first output current and the second output current,
wherein the first current supply circuit includes a first current mirror including a first output transistor for outputting the first output current; the second current supply circuit includes a second current mirror including a second output transistor for outputting the second output current; the input transistor is coupled between the first current mirror and the input resistor and includes an input gate, an input high-voltage terminal, and an input low-voltage terminal; the input gate receives the input voltage having an influence on a voltage of the input high-voltage terminal; and the VCO filter receives the voltage of the input high-voltage terminal and thereby outputs a filtered voltage to a gate of the second output transistor.

2. The VCO of claim 1, wherein the input resistor is coupled between the input transistor and a low voltage terminal.

3. The VCO of claim 1, wherein the VCO filter includes the capacitor and the passive component, the capacitor is coupled between a high voltage terminal and the gate of the second output transistor, and the passive component is coupled between the input high-voltage terminal and the gate of the second output transistor.

4. The VCO of claim 3, wherein the passive component is a resistor.

5. The VCO of claim 1, wherein the VCO filter includes the capacitor and the active component, the capacitor is coupled between a high voltage terminal and the gate of the second output transistor, and the active component is coupled between the input high-voltage terminal and the gate of the second output transistor.

6. The VCO of claim 5, wherein the active component is an amplifier.

7. A voltage-controlled oscillator (VCO), comprising:
an input circuit configured to generate an input current according to an input voltage;
a first current supply circuit configured to generate a first output current according to the input current;
a second current supply circuit configured to generate a second output current according to the input current;
a VCO filter coupled to the input circuit and the second current supply circuit, and the VCO filter configured to slow down an influence caused by a variation of the input current on the second current supply circuit, wherein the VCO includes a capacitor that is coupled to the input circuit via a passive component or an active component; and
an oscillating circuit configured to generate an output clock according to the first output current and the second output current,
wherein the first current supply circuit includes a first current mirror; the second current supply circuit includes a second current mirror; the input circuit includes a first input transistor including a first input gate, a first input high-voltage terminal, and a first input low-voltage terminal; the first input gate receives the input voltage having an influence on a voltage of the first input high-voltage terminal; the first current mirror includes a first output transistor for outputting the first output current according to the voltage of the first input high-voltage terminal; the second current mirror includes a second output transistor for outputting the second output current; the input circuit further includes a second input transistor including a second input gate, a second input high-voltage terminal, and a second input low-voltage terminal; the second input gate receives the input voltage having an influence on a voltage of the second input high-voltage terminal; and the VCO filter receives the voltage of the second input high-voltage terminal and thereby outputs a filtered voltage to a gate of the second output transistor,
wherein the VCO filter includes the capacitor and the active component, the capacitor is coupled between a high voltage terminal and the gate of the second output transistor, and the active component is coupled between the second input high-voltage terminal and the gate of the second output transistor.

8. The VCO of claim 7, wherein the input circuit further includes a first input resistor and a second input resistor, the first input resistor is coupled between the first input transistor and a low voltage terminal, and the second input resistor is coupled between the second input transistor and the voltage terminal.

9. The VCO of claim 7, wherein the VCO filter includes the capacitor and the passive component, the capacitor is coupled between the high voltage terminal and the gate of the second output transistor, and the passive component is coupled between the second input high-voltage terminal and the gate of the second output transistor.

10. The VCO of claim 9, wherein the passive component is a resistor.

11. The VCO of claim 7, wherein the active component is an amplifier.

* * * * *